United States Patent
Cha et al.

(10) Patent No.: US 10,916,813 B2
(45) Date of Patent: Feb. 9, 2021

(54) BATTERY MANAGEMENT APPARATUS AND METHOD FOR CALIBRATING A STATE OF CHARGE OF A BATTERY

(71) Applicant: LG CHEM, LTD., Seoul (KR)

(72) Inventors: Sun-Young Cha, Daejeon (KR); Won-Tae Joe, Daejeon (KR)

(73) Assignee: LG CHEM, LTD., Seoul (KR)

( * ) Notice: Subject to any disclaimer, the term of this patent is extended or adjusted under 35 U.S.C. 154(b) by 227 days.

(21) Appl. No.: 16/094,092

(22) PCT Filed: Dec. 1, 2017

(86) PCT No.: PCT/KR2017/014031
§ 371 (c)(1),
(2) Date: Oct. 16, 2018

(87) PCT Pub. No.: WO2018/124511
PCT Pub. Date: Jul. 5, 2018

(65) Prior Publication Data
US 2019/0123394 A1   Apr. 25, 2019

(30) Foreign Application Priority Data

Jan. 2, 2017 (KR) .................. 10-2017-0000359

(51) Int. Cl.
*G01R 31/3828* (2019.01)
*G01R 31/367* (2019.01)
(Continued)

(52) U.S. Cl.
CPC ........ *H01M 10/425* (2013.01); *G01R 31/367* (2019.01); *G01R 31/389* (2019.01);
(Continued)

(58) Field of Classification Search
CPC ............ H01M 10/425; H01M 10/4271; G01R 31/382; G01R 31/374; G01R 31/389; G01R 31/3828
(Continued)

(56) References Cited

U.S. PATENT DOCUMENTS 4,876,513 A * 10/1989 Brilmyer ............... G01R 31/379
                                                                                  324/427
5,321,627 A * 6/1994 Reher ................... G01R 31/379
                                                                                  702/63
(Continued)

FOREIGN PATENT DOCUMENTS

CN        101010596 A       8/2007
CN        102437629 A       5/2012
(Continued)

OTHER PUBLICATIONS

Texas instruments, "Battery Monitoring Basics", Dallas, Oct. 31, 2012 (Oct. 31, 2012), 52 pages total.
(Continued)

*Primary Examiner* — Christopher P McAndrew
(74) *Attorney, Agent, or Firm* — Birch, Stewart, Kolasch & Birch, LLP

(57) ABSTRACT

Disclosed is a battery management apparatus and method for calibrating the state of charge (SOC) of a lithium iron phosphate (LFP) battery. The battery management apparatus according to an embodiment of the present disclosure calculates, when going into calibration mode, an average voltage value of voltage values received from a voltage measuring unit for a predefined time, calculates an average current value of current values received from a current measuring unit for the predefined time, calculates an average internal resistance value of the LFP battery for the predefined time based on the average voltage value and the average current value, determines if the average internal
(Continued)

resistance value is equal to or larger than a preset reference resistance value, and when the average internal resistance value is equal to or larger than the reference resistance value, calibrates the current SOC to a preset reference SOC.

15 Claims, 7 Drawing Sheets

(51) Int. Cl.
| | |
|---|---|
| *G01R 31/3842* | (2019.01) |
| *G01R 31/389* | (2019.01) |
| *G01R 31/374* | (2019.01) |
| *H01M 10/42* | (2006.01) |
| *H01M 10/48* | (2006.01) |
| *H01M 4/58* | (2010.01) |

(52) U.S. Cl.
CPC ..... *G01R 31/3828* (2019.01); *G01R 31/3842* (2019.01); *H01M 4/5825* (2013.01); *H01M 10/42* (2013.01); *H01M 10/48* (2013.01); *G01R 31/374* (2019.01); *H01M 2010/4271* (2013.01)

(58) Field of Classification Search
USPC .......................................................... 324/430
See application file for complete search history.

(56) References Cited

U.S. PATENT DOCUMENTS

| | | | | |
|---|---|---|---|---|
| 2005/0233219 A1* | 10/2005 | Gozdz | ................ | H01M 4/5825 429/231.95 |
| 2006/0181245 A1* | 8/2006 | Mizuno | ................ | G01R 31/367 320/132 |
| 2008/0169819 A1 | 7/2008 | Ishii | | |
| 2012/0202113 A1* | 8/2012 | Hodge | ................ | H01M 4/364 429/211 |
| 2013/0110429 A1* | 5/2013 | Mitsuyama | .......... | G01R 31/367 702/63 |
| 2013/0154652 A1* | 6/2013 | Rice | .................... | H01M 10/486 324/426 |
| 2014/0111164 A1* | 4/2014 | Ohkawa | .................. | B60L 50/51 320/134 |
| 2014/0236511 A1 | 8/2014 | Kulkarni et al. | | |
| 2015/0017499 A1* | 1/2015 | Nishiyama | ............ | H01M 4/505 429/94 |
| 2015/0051855 A1* | 2/2015 | Joe | .................... | H01M 10/4285 702/63 |
| 2015/0066407 A1* | 3/2015 | Joe | ........................ | H01M 10/48 702/63 |
| 2015/0070024 A1* | 3/2015 | Kim | ....................... | H01M 10/48 324/430 |
| 2015/0100260 A1* | 4/2015 | Joe | ........................ | H01M 10/48 702/63 |
| 2016/0011275 A1 | 1/2016 | Saito et al. | | |
| 2016/0107526 A1* | 4/2016 | Jin | .......................... | B60L 58/26 307/10.1 |
| 2016/0202325 A1* | 7/2016 | Tang | .................. | G01R 31/3648 702/63 |
| 2016/0238662 A1 | 8/2016 | Danner | | |
| 2016/0301219 A1* | 10/2016 | Desprez | ..................... | H02J 7/04 |
| 2017/0045587 A1* | 2/2017 | Kim | ....................... | G01R 31/367 |
| 2017/0199250 A1 | 7/2017 | Yoon et al. | | |
| 2017/0269165 A1* | 9/2017 | Takashima | .............. | G01R 31/36 |
| 2018/0198161 A1* | 7/2018 | Krasovitsky | ...... | H01M 10/0525 |
| 2019/0123394 A1* | 4/2019 | Cha | ..................... | G01R 31/3842 |
| 2019/0318882 A1* | 10/2019 | Cao | ........................ | H01G 11/24 |
| 2020/0119411 A1* | 4/2020 | Krasovitsky | ............ | H02J 7/005 |

FOREIGN PATENT DOCUMENTS

| | | |
|---|---|---|
| CN | 105164392 A | 12/2015 |
| CN | 106249173 A | 12/2016 |
| DE | 102009058893 A1 | 7/2010 |
| EP | 1 691 209 A1 | 8/2006 |
| EP | 2 323 238 A2 | 5/2011 |
| JP | 2007-053005 A | 3/2007 |
| JP | 2010-249770 A | 11/2010 |
| JP | 2013-085315 A | 5/2013 |
| JP | 2015-059816 A | 3/2015 |
| KR | 10-2012-0082965 A | 7/2012 |
| KR | 10-1238478 B1 | 3/2013 |
| KR | 10-2014-0082752 A | 7/2014 |
| KR | 10-2014-0094486 A | 7/2014 |
| KR | 10-1484241 B1 | 1/2015 |
| KR | 10-2015-0019190 A | 2/2015 |
| KR | 10-2016-0051007 A | 5/2016 |
| KR | 10-2016-0103396 A | 9/2016 |
| WO | WO 2016/054732 A1 | 4/2016 |

OTHER PUBLICATIONS

International Search Report for PCT/KR2017/014031 (PCT/ISA/210) dated Mar. 28, 2018.

* cited by examiner (a)

(b)

BATTERY MANAGEMENT APPARATUS AND METHOD FOR CALIBRATING A STATE OF CHARGE OF A BATTERY

TECHNICAL FIELD

The present application claims priority to Korean Patent Application No. 10-2017-0000359 filed in the Republic of Korea on Jan. 2, 2017, the disclosures of which are incorporated herein by reference.

The present disclosure relates to a battery management apparatus, and more particularly, to an apparatus and method for calibrating the state of charge (SOC) of a lithium iron phosphate battery.

BACKGROUND ART

Batteries can be repeatedly charged and discharged, and thus they are used as a source of power in various fields. For example, lithium ion batteries area used in handheld devices such as mobile phones, laptop computers, digital cameras, video cameras, tablet computers and electric tools, as well as various types of electric power systems including e-bikes, electric motorcycles, electric vehicles, hybrid electric vehicles, electric ship and electric aircraft.

To stably use various types of devices or systems that receive energy from batteries, accurate information associated with the state of charge (SOC) of the battery is essential. Particularly, the SOC is an indication of how long the battery will be stably usable. For example, battery-mounted devices such as laptop computers, mobile phones and vehicles estimate the SOC and provide information associated with the available time converted from the estimated SOC to users.

The SOC of the battery is generally expressed as a percentage of the current remaining capacity to the design capacity at the factory, and in this case, a current integration method (ampere counting) is widely used to determine the SOC.

The current integration method is a method that estimates the capacity remaining in the battery by periodically integrating the measured value of the charge/discharge current flowing through the battery over time, and the temperature of the battery may be optionally taken into account.

However, the downside of the current integration method is that accuracy gradually reduces over time due to measurement errors of a current sensor. In other words, the current integration method is based on measured current values from the current sensor, and there is a difference between the measured current values outputted from the current sensor and the current actually flowing through the battery. This difference is so small that it can be neglected for a very short time, but when the difference is accumulated over time, the accumulated error is so large that cannot be neglected any longer.

As the related art for solving the problem of the current integration method, Patent Literature 1 (Korean Patent No. 10-1651829) is disclosed. Patent Literature 1 provides estimating the SOC from the open circuit voltage (OCV) of a battery using an OCV-SOC curve of the battery. To estimate the SOC using the OCV-SOC curve, it requires a precondition in which definite changes in OCV should be seen in response to changes in SOC of the battery.

A lithium iron phosphate battery (hereinafter referred to as 'LFP battery') is a battery using lithium iron phosphate ($Li_xFePO_4$) as an active material of the positive electrode. The 'LFP battery has a long life advantage. However, as can be seen from FIG. 1, in the case of a lithium iron phosphate battery, changes in OCV are smaller during an optimum use range (e.g., SOC 30°~95%) than other types of batteries. Specifically, FIG. 1 schematically illustrates the charge profiles of each of a lithium ion battery and an LFP battery shown in previous experiments performed while constantly maintaining a predefined temperature. The line marked with ♦ in FIG. 1 shows an OCV-SOC curve of the lithium ion battery using $LiCoO_2$ for the positive electrode, and the line marked with ● shows an OCV-SOC curve of the LFP battery using $LiFePO_4$ for the positive electrode, the LFP battery has little change in OCV within the SOC range except the end of charge and the end of discharge. Accordingly, SOC estimation or calibration using the OCV-SOC curve is unsuitable for the use in LFP batteries.

DISCLOSURE

Technical Problem

The present disclosure is designed under the background of the related art as described above, and therefore, the present disclosure is directed to providing a battery management apparatus for accurately calibrating the state of charge (SOC) of a lithium iron phosphate (LFP) battery in consideration of the characteristics of changes in OCV and internal resistance as a function of SOC of the LFP battery and a method for calibrating SOC using the same.

Technical Solution

To achieve the object, a battery management apparatus according to an aspect of the present disclosure is configured to calibrate a state of charge (SOC) of a lithium iron phosphate (LFP) battery. The apparatus includes a voltage measuring unit configured to measure a voltage of the LFP battery and output a voltage value indicative of the measured voltage, a current measuring unit configured to measure a current of the LFP battery and output a current value indicative of the measured current, and a control unit configured to individually receive the voltage value and the current value and determine the SOC of the LFP battery based on results of integrating the current value over time. When the control unit enters calibration mode, the control unit is configured to calculate an average voltage value of voltage values received from the voltage measuring unit for a predefined time, calculate an average current value of current values received from the current measuring unit for the predefined time, calculate an average internal resistance value of the LFP battery for the predefined time based on the average voltage value and the average current value, determine if the average internal resistance value is equal to or larger than a preset reference resistance value, and when the average internal resistance value is equal to or larger than the reference resistance value, calibrate the determined SOC to a preset reference SOC.

According to circumstances, the battery management apparatus may further include a temperature measuring unit configured to measure a temperature of the LFP battery and output a temperature value indicative of the measured temperature. In this case, the control unit may be configured to determine the SOC of the LFP battery further based on the temperature value outputted by the temperature measuring unit.

Additionally, the battery management apparatus may further includes a memory unit configured to store a lookup table defining a correspondence relationship between preset reference temperature values and reference resistance values.

Preferably, the lookup table includes a first storage area in which a first reference temperature value and a first reference resistance value associated with the first reference temperature value are recorded, and a second storage area in which a second reference temperature value larger than the first reference temperature value and a reference resistance value associated with the second reference temperature value are recorded, and the first reference resistance value may be larger than the second reference resistance value.

Additionally, the control unit may be configured to select any one reference temperature value recorded in the lookup table based on the temperature value received from the temperature measuring unit for the predefined time, select a reference resistance value corresponding to the reference temperature value selected from the lookup table, and when the average internal resistance value is equal to or larger than the selected reference resistance value, calibrate the determined SOC to the reference SOC. In this instance, the reference resistance value may be a value indicative of an internal resistance of the LFP battery when the SOC of the LFP battery is equal to the reference SOC.

Preferably, the control unit is configured to calculate the average internal resistance value using the following Equation 1:

$$R_{ave} = \frac{V_{ave} - OCV_{ref}}{I_{ave}} \qquad \text{<Equation 1>}$$

in which in the Equation 1, $V_{ave}$ is the average voltage value, $I_{ave}$ is the average current value, $OCV_{ref}$ is a preset reference open circuit voltage (OCV) value, $R_{ave}$ is the average internal resistance value. In this instance, the reference OCV value may be a value indicative of an OCV of the LFP battery when the SOC of the LFP battery is equal to the reference SOC.

Selectively, the predefined time may be a specified value that is equal to or larger than 1 second and equal to or smaller than 2 seconds, and the reference SOC may be a value indicating that a remaining capacity of the LFP battery is 99% of design capacity.

A battery pack according to another aspect of the present disclosure includes the battery management apparatus.

A method for calibrating an SOC of an LFP battery according to still another aspect of the present disclosure is performed by the battery management apparatus, and includes receiving a voltage value indicative of a voltage of the LFP battery, receiving a current value indicative of a current of the LFP battery, determining the SOC of the LFP battery based on results of integrating the current value over time, and calibrating the determined SOC by entering calibration mode. In this case, the calibrating the determined SOC includes calculating an average voltage value of voltage values received for a predefined time, calculating an average current value of current values received for the predefined time, calculating an average internal resistance value of the LFP battery for the predefined time based on the average voltage value and the average current value, determining if the average internal resistance value is equal to or larger than a preset reference resistance value, and when the average internal resistance value is equal to or larger than the reference resistance value, calibrating the determined SOC to a preset reference SOC.

Advantageous Effects

According to at least one of the embodiments of the present disclosure, the state of charge (SOC) of a lithium iron phosphate (LFP) battery can be accurately calibrated in consideration of the characteristics of changes in OCV and internal resistance as a function of SOC of the LFP battery.

Additionally, it is possible to reduce a problem with notification of an inaccurate SOC to a user due to continuously accumulated measurement error of a current sensor over time in the conventional ampere counting technique.

BRIEF DESCRIPTION OF THE DRAWINGS

The accompanying drawings illustrate an embodiment of the present disclosure and together with the following detailed description, serve to provide further understanding of the technical aspects of the present disclosure, and thus the present disclosure is not construed as being limited to the statements in such drawings.

MODE FOR CARRYING OUT THE INVENTION

Figure 1:
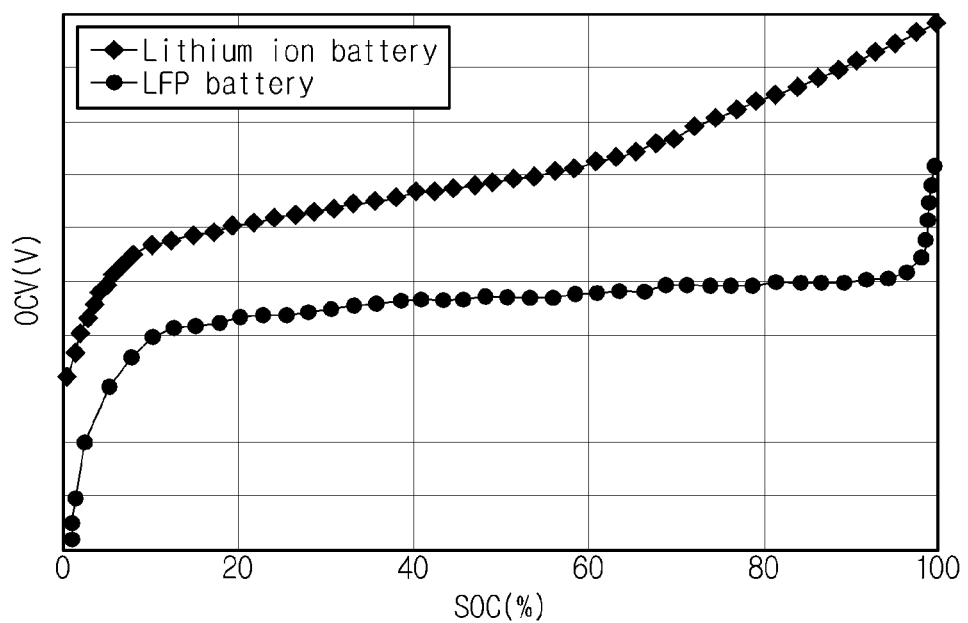
FIG. 1 is a schematic graph showing an open circuit voltage (OCV)-state of charge (SOC) curve of each of a lithium iron phosphate (LFP) battery and a general lithium ion battery.

Hereinafter, embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define terms appropriately for the best explanation. Therefore, the embodiments described herein and illustrations shown in the drawings are just an embodiment of the present disclosure, but not intended to fully describe the technical aspects of the present disclosure, so it should be understood that other equivalents and modifications could be made thereto at the time the invention was made.

In the embodiments described below, a lithium iron phosphate (LFP) battery may refer to a unit cell including an assembly of positive electrode/separator/negative electrode and an electrolyte in a packaging as well as an assembly including unit cells connected in series or in parallel. The LFP battery may be included in a battery pack, together with the battery management apparatus 100 described below.

Figure 2:
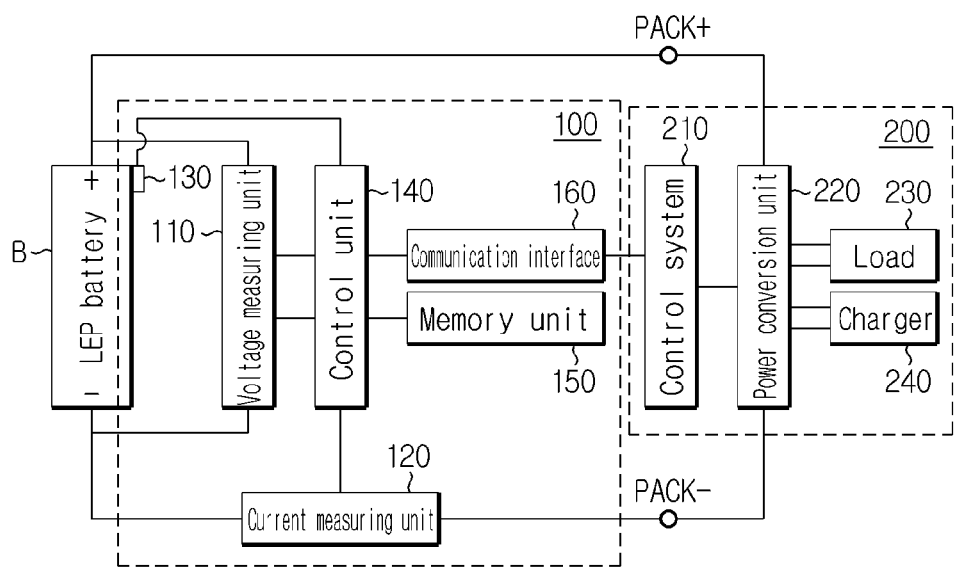
FIG. 2 is a block diagram of a power system according to an embodiment of the present disclosure.

FIG. 2 is a block diagram of a power system according to an embodiment of the present disclosure.

Referring to FIG. 2, the power system according to an embodiment of the present disclosure includes a battery management apparatus 100 and a load device 200.

The battery management apparatus 100 includes a voltage measuring unit 110, a current measuring unit 120 and a control unit 140, and optionally may further include a temperature measuring unit 130.

The apparatus 100 is configured to calibrate the state of charge (SOC) of a lithium iron phosphate (LFP) battery B to a preset specified value when a preset condition is satisfied. Here, the LFP battery B refers to a battery including an LFP cell or two or more LFP cells connected in series.

The LFP battery B is electrically connected to the load device 200 through a high potential terminal (PACK+) and a low potential terminal (PACK−). The load device 200 refers to a device that operates with power outputted from the LFP battery B or operates to charge the LFP battery B to the required voltage.

The load device 200 includes a control system 210, a power conversion unit 220 and a load 230. Optionally, the load device 200 may further include a charger 240. The charger 240 may supply a charge current for charging the LFP battery B to the LFP battery B through the power conversion unit 220. The charger 240 may produce a charge current itself, and may produce a charge current by receiving power from a commercial power source.

In a preferred example, the load 230 may be a motor included an electric vehicle or a hybrid electric vehicle, and the power conversion unit 220 may be an inverter capable of bi-directional power conversion.

The control system 210 is a computing system that controls the overall operation of the load device 200. Particularly, the control system 210 may control the charge and discharge of the LFP battery B using the output parameter of the LFP battery B provided by the control unit 140.

The power conversion unit 220 transmits the discharge output of the LFP battery B to the load 230. In this instance, the power conversion unit 220 may adjust the extent of power conversion under the control of the control system 210 so that the LFP battery B may be discharged in the range of the output parameter.

On the contrary, the power conversion unit 220 may transmit the charge output supplied from the charger 240 to the LFP battery B. In this instance, the power conversion unit 220 may adjust the extent of power conversion under the control of the control system 210 so that the LFP battery B may be charged in the range of the output parameter.

The apparatus 100 according to the present disclosure may further include a memory unit 150. The memory unit 150 is not limited to a particular type of storage medium when it can record and delete information. For example, the memory unit 150 may include RAM, ROM, register, hard disk, an optical recording medium or a magnetic recording medium.

The memory unit 150 may be electrically connected to the control unit 140 through, for example, a data bus, to allow the control unit 140 to access it.

Additionally, the memory unit 150 stores and/or updates and/or deletes and/or transmits programs including various types of control logics executed by the control unit 140, and/or data created when the control logic is executed.

The memory unit 150 can be logically divided into two or more, and may be included in the control unit 140 without limitations.

The voltage measuring unit 110 is electrically coupled with the control unit 140 to transmit and receive electrical signals. The voltage measuring unit 110 measures the voltage applied between the positive electrode and the negative electrode of the LFP battery B at a time interval under the control of the control unit 140 and outputs a voltage value indicative of the measured voltage to the control unit 140. The control unit 140 stores the voltage value outputted from the voltage measuring unit 110 in the memory unit 150. For example, the voltage measuring unit 110 may include a voltage sensor commonly used in the art.

The current measuring unit 120 is electrically coupled with the control unit 140 to transmit and receive electrical signals. The current measuring unit 120 measures the current flowing through the LFP battery B at a time interval under the control of the control unit 140 and outputs a current value indicative of the measured current to the control unit 140. The control unit 140 stores the current value outputted from the current measuring unit 120 in the memory unit 150. For example, the current measuring unit 120 may include a hall sensor or a sense resistor commonly used in the art.

The temperature measuring unit 130 is electrically coupled with the control unit 140 to transmit and receive electrical signals. The temperature measuring unit 130 measures the temperature of the LFP battery B at a time interval and outputs a temperature value indicative of the measured temperature to the control unit 140. The control unit 140 stores the temperature value outputted from the temperature measuring unit 130 in the memory unit 150. For example, the temperature measuring unit 130 may include a thermocouple commonly used in the art.

At least one of the voltage measuring unit 110, the current measuring unit 120 and the temperature measuring unit 130 may be implemented in a manner of including an ADC. Here, the ADC refers to a known analog-to-digital converter.

The apparatus 100 according to the present disclosure may further include a communication interface 160. The communication interface 160 is an essential element necessary for the control unit 140 to establish communication with the control system 210 included in the load device 200.

The communication interface 160 includes any known communication interface that supports communication between two different systems. The communication interface may support wired or wireless communication. Preferably, the communication interface may support controller area network (CAN) communication or daisy chain communication.

The control unit 140 may determine the SOC of the LFP battery B selectively using at least one of the voltage value of the LFP battery B outputted by the voltage measuring unit 110 and the current value of the LFP battery B outputted by the current measuring unit 120 and the temperature value of the LFP battery B outputted by the temperature measuring unit 130.

For example, the SOC of the LFP battery B may be a value determined using the ampere counting method. In other words, the control unit 140 may not only continuously monitor the SOC of the LFP battery B but also update the latest determined SOC using the SOC determined at the current time, based on the results of integrating the current value periodically measured through the current measuring unit 120 over time. In the case of using the ampere counting method, the temperature value of the LFP battery B may be used to correct the integrated amount of current.

The control unit 140 monitors the voltage value sequentially outputted by the voltage measuring unit 110 and the current value sequentially outputted by the current measuring unit 120. In this instance, the voltage measurement time by the voltage measuring unit 110 and the current measurement time by the current measuring unit 120 may be synchronized with each other. Optionally, the temperature measurement time by the temperature measuring unit 130 may be also synchronized with the voltage measurement time by the voltage measuring unit 110 or the current measurement time by the current measuring unit 120. Additionally, the control unit 140 may store, in the memory unit 150, a predefined number of voltage values and a predefined number of current values respectively outputted from the voltage measuring unit 110 and the current measuring unit 120 for a predefined period in the past from the present time.

The control unit 140 may operate at least in normal mode and calibration mode. The normal mode indicates a mode in which an operation of determining the SOC of the LFP battery B through the above-described ampere counting technique is performed. By contrast, the calibration mode indicates a mode in which an operation of calibrating the SOC determined in normal mode is performed. That is, the control unit 140 may operate in normal mode, and when a predefined condition is satisfied, shift to calibration mode, or may operate in calibration mode, and when a predefined condition is satisfied, shift to normal mode. In this instance, it is obvious to those skilled in the art that the condition required for a shift from normal mode to calibration mode and the condition required for a shift from calibration mode to normal mode may be different from each other.

Figure 3:
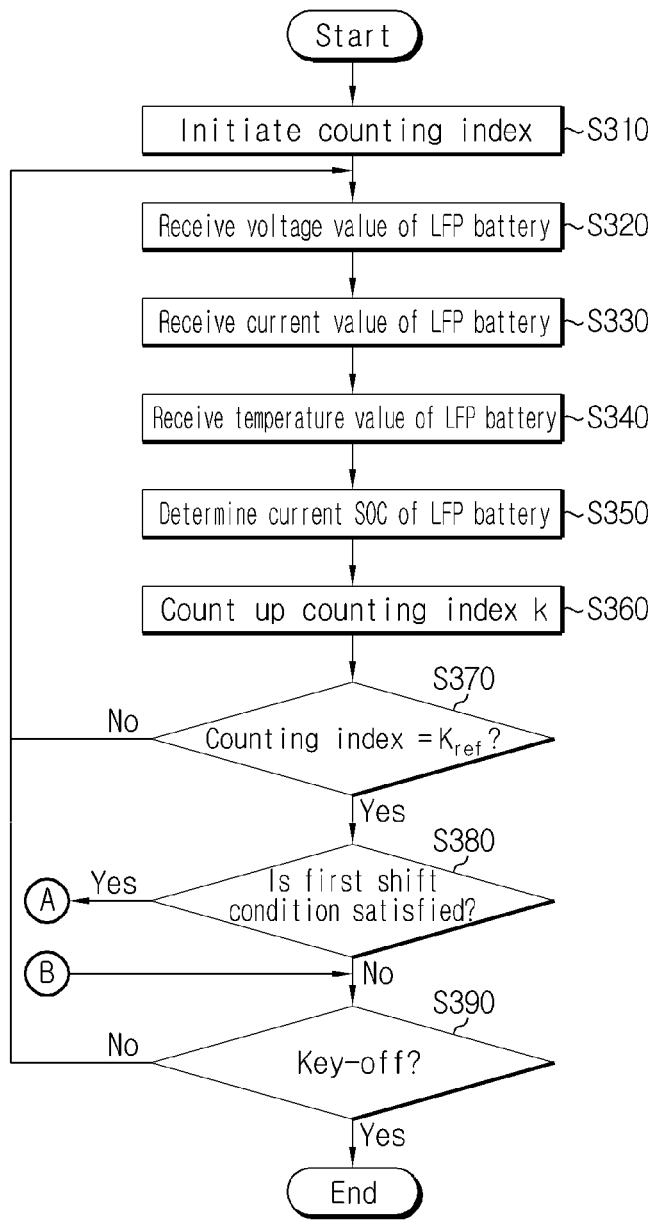
FIGS. 3 and 4 are flowcharts showing the steps included in a process executed by a battery management apparatus according to an embodiment of the present disclosure.
Figure 4:
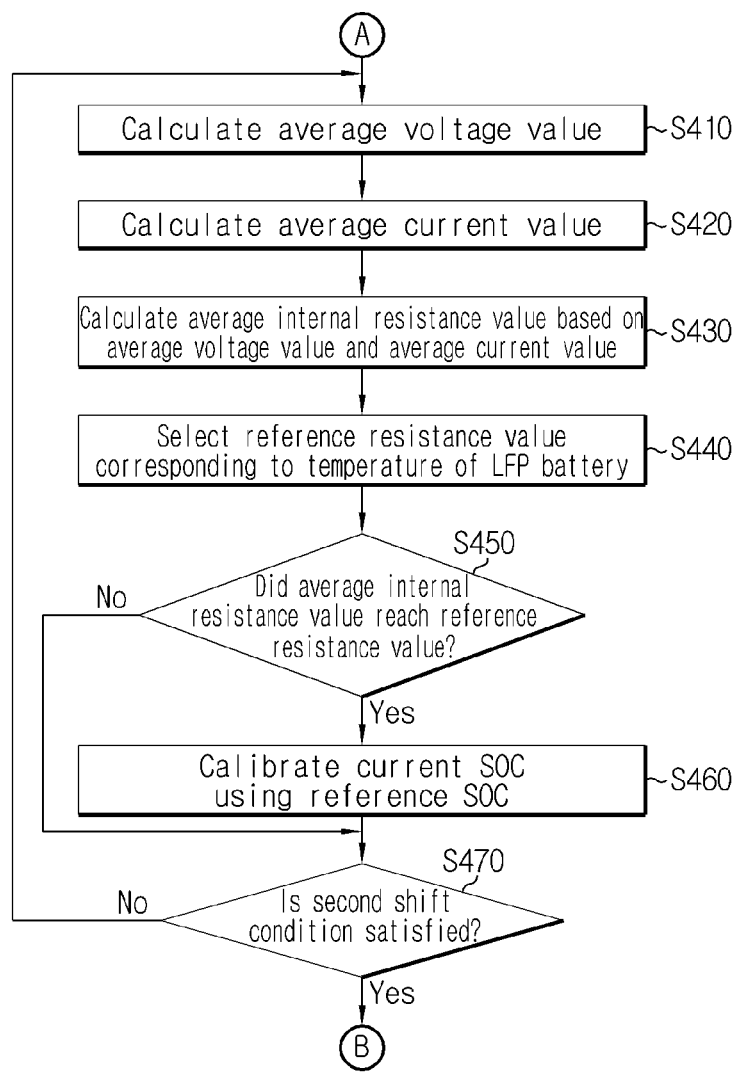
Figure 5:
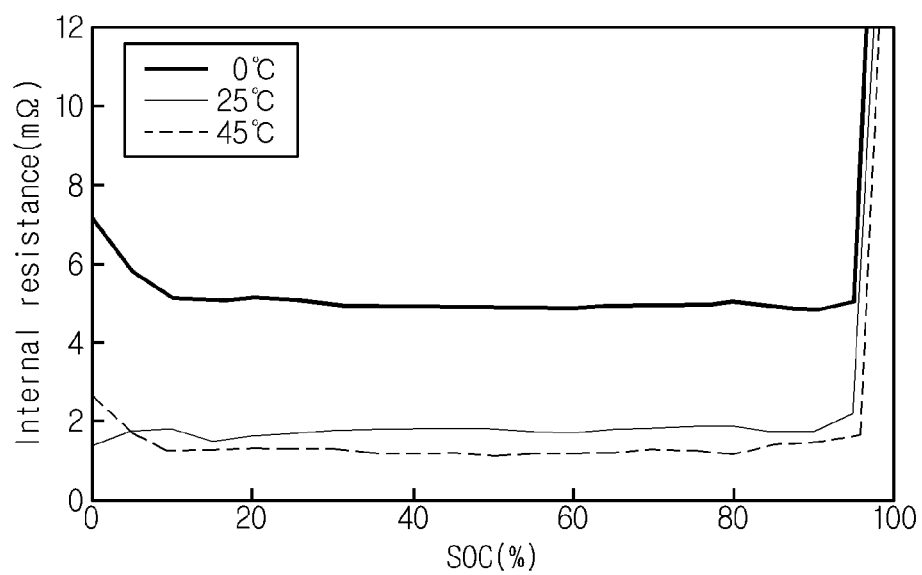
FIG. 5 is a graph showing an internal resistance curve as a function of temperature of an LFP battery.

FIGS. 3 and 4 are flowcharts showing a method for calibrating SOC performed by the battery management apparatus 100 according to an embodiment of the present disclosure, and FIG. 5 is a graph showing an internal resistance curve as a function of temperature of the LFP battery. Additionally, the steps shown in FIG. 3 and the steps shown in FIG. 4 may be performed at least once every preset cycle. In addition, three different internal resistance curves shown in FIG. 5 are obtained through previous experiments in which the LFP battery B is charged with a constant current having predefined level from the time at which the SOC is 0 to the time at which the SOC is 1 while maintaining the temperature of the LFP battery B at 0° C., 25° C. and 45° C. respectively.

First, FIG. 3 shows the steps related to a process in normal mode.

Referring to FIG. 3, in S310, the control unit 140 enters normal mode to initiate a counting index k. For example, the control unit 140 may initiate the counting index by allocating 1 to the counting index k. In this instance, the counting index is a factor for counting how many times the control unit 140 has received measurement values from at least one of the voltage measuring unit 110, the current measuring unit 120 and the temperature measuring unit 130.

In S320, in response to the request from the control unit 140, the voltage measuring unit 110 measures the voltage of the LFP battery B, and outputs a voltage value indicative of the measured voltage to the control unit 140. That is, the control unit 140 receives the voltage value from the voltage measuring unit 110.

In S330, in response to the request from the control unit 140, the current measuring unit 120 measures the current of the LFP battery B, and outputs a current value indicative of the measured current to the control unit 140. That is, the control unit 140 receives the current value from the current measuring unit 120.

In S340, in response to the request from the control unit 140, the temperature measuring unit 130 measures the temperature of the LFP battery B, and outputs a temperature value indicative of the measured temperature to the control unit 140. That is, the control unit 140 receives the temperature value from the temperature measuring unit 130.

Although FIG. 3 shows S320, S330 and S340 performed in a sequential order, the order of these steps is not limited to the order shown in FIG. 3, and S320, S330 and S340 may be simultaneously performed. That is, the voltage measurement time by the voltage measuring unit 110 may be synchronized with the current measurement time by the current measuring unit 120 and the temperature measurement time by the temperature measuring unit 130.

The control unit 140 may receive each of the voltage value, the current value and the temperature value of the LFP battery B simultaneously or sequentially through S320, S330 and S340, and individually store them in the memory unit 150.

In S350, the control unit 140 may determine the current SOC of the LFP battery B based on at least one of the voltage value and the current value of the LFP battery B. In this instance, the temperature value of the LFP battery B may be optionally considered when determining the current SOC of the LFP battery B. Preferably, the control unit 140 may update the latest determined SOC using the current integration method based on the current value of the LFP battery B received through S330. The control unit 140 may transmit a signal notifying the current SOC determined through S350 to the load device 200 through the interface unit 160.

In S360, the control unit 140 counts up the counting index k. That is, the control unit 140 increases the counting index k by a predefined value (e.g., 1). Although FIG. 3 shows the S350 precedes S360, S360 may be performed earlier than or simultaneously with S350.

In S370, the control unit 140 determines if the counting index k is equal to a preset number $k_{ref}$(e.g., 3). If the determination result of S370 is "YES", the process moves to S380. If the determination result of S370 is "NO", the process may move to S320 or S330.

In S380, the control unit 140 may determine if a preset first shift condition is satisfied. Here, the first shift condition may be a condition that is preset for a shift from normal mode to calibration mode. According to an embodiment, the first shift condition is that the SOC determined through S350 reaches a preset threshold SOC. That is, the control unit 140 may determine whether to maintain the operation in normal mode or shift from normal mode to calibration mode by comparing the SOC determined through S350 to the threshold SOC. In this instance, a value designated as the threshold SOC may be pre-stored in the memory unit 150.

If the determination result of S380 is "NO", the control unit 140 moves to S390. If the determination result of S380 is "YES", the control unit 140 may move to S410.

In S390, the control unit 140 determines if the operating condition of the LFP battery B is a key-off condition. Here, the key-off condition refers to a case in which the battery B stopped charging or discharging. The control unit 140 may determine if the LFP battery B is currently in a key-off condition based on the connection condition of a switch component that controls the connection between the LFP battery B and the load device 200.

If the determination result of S390 is "NO", the control unit 140 may return to S320. If the determination result of S390 is "YES", the control unit 140 may terminate the process.

Referring to FIG. 4, in S410, the control unit 140 calculates an average voltage value. In this instance, the average voltage value may be an average of voltage values received from the voltage measuring unit 110 for a predefined first time (e.g., a specified value that is equal to or larger than 1 second and equal to or smaller than 2 seconds).

In S420, the control unit 140 calculates an average current value. In this instance, the average current value may be an average of current values received from the current measuring unit 120 for the first time. Although FIG. 4 shows that S410 precedes S420, S420 of the two steps may precede S410.

In this instance, the number of voltage values and the number of current values considered in the average voltage value and the average current value respectively may be equal to or larger than the preset number $k_{ref}$ in S370. Additionally, the first time is a value that is preset for filtering noise such as momentary fluctuations of voltage and current of the LFP battery B.

In S430, the control unit 140 may calculate an average internal resistance value of the LFP battery B based on the average voltage value calculated through S410 and the average current value calculated through S420. In this instance, the average internal resistance value may represent a resistance value of internal resistance of the LFP battery B appearing for the first time.

Preferably, the control unit 140 may calculate the average internal resistance value of the LFP battery B using the following Equation 1:

$$R_{ave} = \frac{V_{ave} - OCV_{ref}}{I_{ave}} \qquad \text{<Equation 1>}$$

In Equation 1, $V_{ave}$ is the average voltage value, $I_{ave}$ is the average current value, $OCV_{ref}$ is a preset reference open circuit voltage (OCV) value, and $R_{ave}$ denotes the average internal resistance value. In this instance, the reference OCV value $OCV_{ref}$ of Equation 1 is a value representing an OCV of the LFP battery B when the SOC of the LFP battery B is equal to a reference SOC. Additionally, the reference SOC is a value representing the capacity left at a predefined ratio (e.g., 99%) to the design capacity of the LFP battery B. In this instance, the reference SOC is preferably set to be smaller than 100%. The above-described threshold SOC may be a value that is preset to be lower than the reference SOC. The reference OCV value may be preset through previous experiments and pre-stored in the memory unit 150.

According to circumstances, only when the average internal resistance value $R_{ave}$ calculated using Equation 1 is a positive number, the control unit 140 may perform the process subsequent to S440 described below, and on the contrary, when the average internal resistance value $R_{ave}$ calculated using Equation 1 is 0 or a negative number, the control unit 140 may defer the process subsequent to S440.

In S440, the control unit 140 may select a reference resistance value corresponding to the current temperature of the LFP battery B. In relation to this, a lookup table in a form such as the following Table 1 may be pre-stored in the memory unit 150.

TABLE 1

| Temperature value (° C.) | Reference resistance value (Ω) |
|---|---|
| −20 | 0.020 |
| −10 | 0.0075 |
| 0 | 0.0028 |
| 25 | 0.0014 |

Referring to Table 1 together with FIG. 5, the lookup table may include two or more storage areas, each having a reference temperature value and a reference resistance value associated with each other. For example, the lookup table may include a first storage area and a second storage area. A first reference temperature value and a first reference resistance value associated with the first reference temperature value may be recorded in the first storage area, and a second reference temperature value and a second reference resistance value associated with the second reference temperature value may be recorded in the second storage area. If the second reference temperature value is larger than the first reference temperature value, the first reference resistance value may be larger than the second reference resistance value. This is because the experimental results are reflected in which even though the SOC is the same, the resistance value of internal resistance gradually reduces with the increasing temperature of the LFP battery B as shown in FIG. 5.

Taking an instance of determining the reference resistance value from the lookup table such as Table 1, when the temperature of the LFP battery B measured through S340 is 1° C., the control unit 140 may select 0° C. closest to the temperature of 1° C. measured by the temperature measuring unit 130 from the temperature values recorded in the lookup table, and select the reference resistance value of 0.0028Ω connected with the selected 0° C.

Meanwhile, although the lookup table of Table 1 shows that four temperature values are each associated with four different reference resistance values and recorded in different storage areas, the lookup table may be segmented into a smaller or larger number of storage areas.

Additionally, when a temperature value corresponding to the current temperature of the LFP battery B is not recorded in the lookup table, the control unit 140 may calculate a reference resistance value corresponding to the current temperature of the LFP battery B through various methods. For example, the control unit 140 may determine a temperature value not recorded in the lookup table from two different temperature values recorded in the lookup table by using an interpolation method. Similarly, the control unit 140 may also determine a reference resistance value not recorded in the lookup table from two different reference resistance values recorded in the lookup table by using an interpolation method.

In S450, the control unit 140 determines if the average internal resistance value reached the reference resistance value by comparing the average internal resistance value calculated through S430 to the reference resistance value selected through S440. In other words, the control unit 140 determines if the average internal resistance value is equal to or larger than the reference resistance value.

If the determination result of S450 is "YES", the control unit 140 moves to S460. If the determination result of S450 is "NO", the control unit 140 may move to S470.

In S460, the control unit 140 calibrates the current SOC using the reference SOC. That is, the control unit 140 updates the current SOC so that the current SOC has the same value as the reference SOC. Through this, the accumulated current measurement error unavoidably occurring in the current integration method may be removed.

In S470, the control unit 140 may determine if a preset second shift condition is satisfied. Here, the second shift condition may be a condition that is preset for a shift from calibration mode to normal mode. According to an embodiment, the second shift condition may be that the charge of the LFP battery B ends and/or a predefined second time (e.g., 60 seconds) elapsed from the time when S460 ends.

If the determination result of S470 is "NO", the control unit 140 moves to S410. If the determination result of S470 is "YES", the control unit 140 may cancel the calibration mode and move to S390.

Meanwhile, when a difference between the current SOC determined through S350 and the reference SOC is larger than a preset reference difference value, the control unit 140 may output an error signal. Specifically, a value obtained by subtracting the current SOC from the reference SOC is larger than a reference difference value, the control unit 140 may determine that an error occurred in the current measuring unit 120, and output the error signal notifying that the current measuring unit 120 needs to be replaced. The error signal outputted from the control unit 140 may be transmitted to the load device 200 through the interface unit 160.

Figure 6:
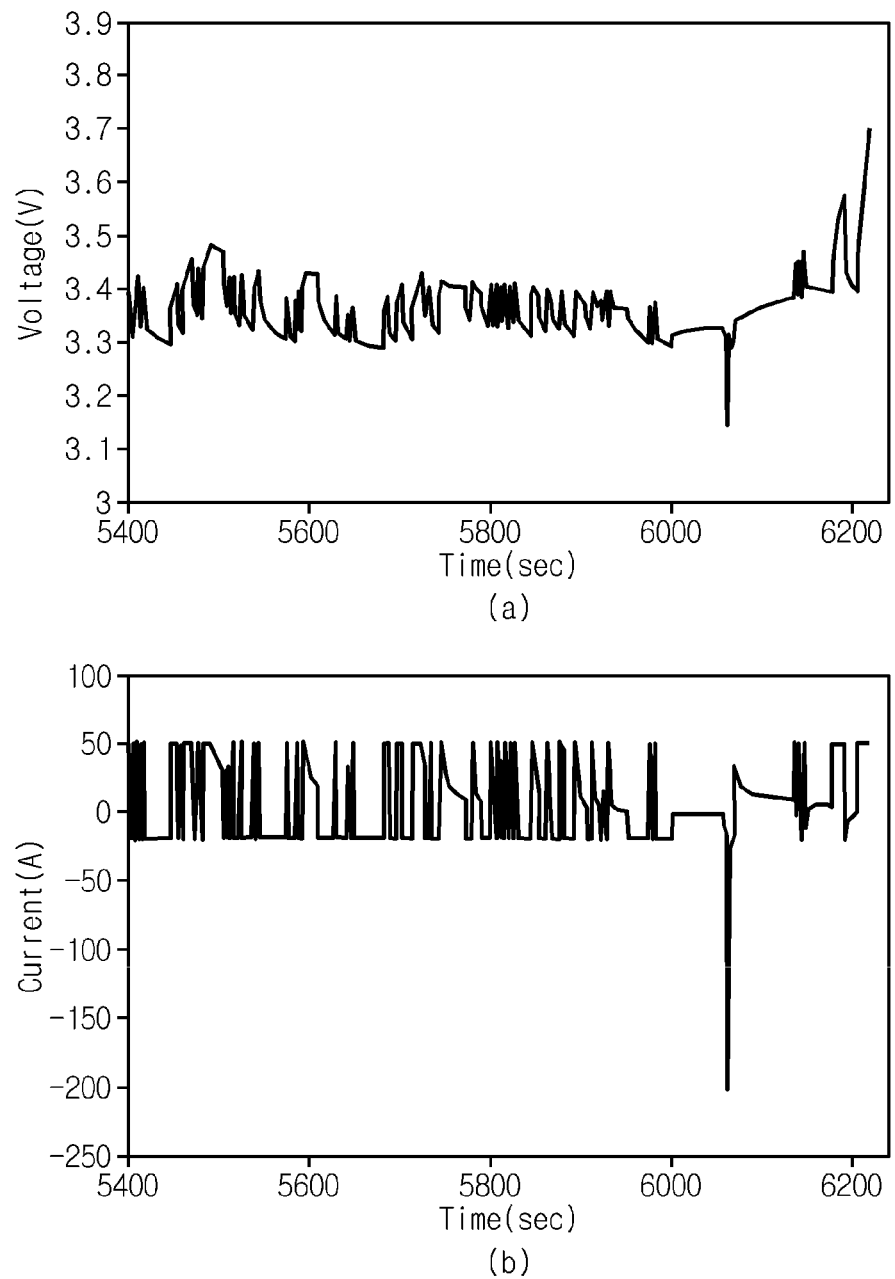
FIGS. 6 and 7 show graphs for reference in the explanation of a difference between use and non-use of a reference open circuit voltage value when calculating an internal resistance of an LFP battery.
Figure 7:
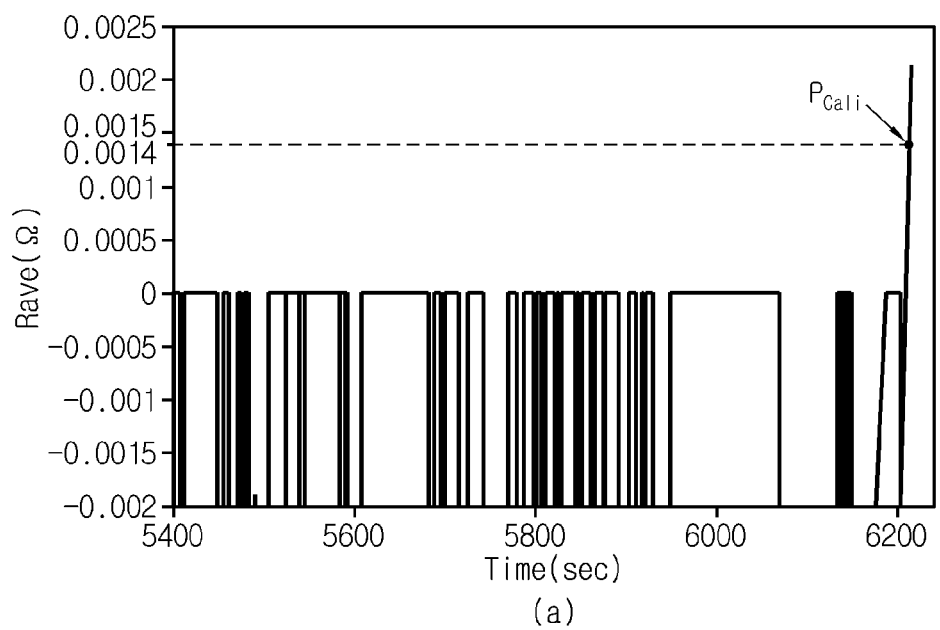
Figure 7:
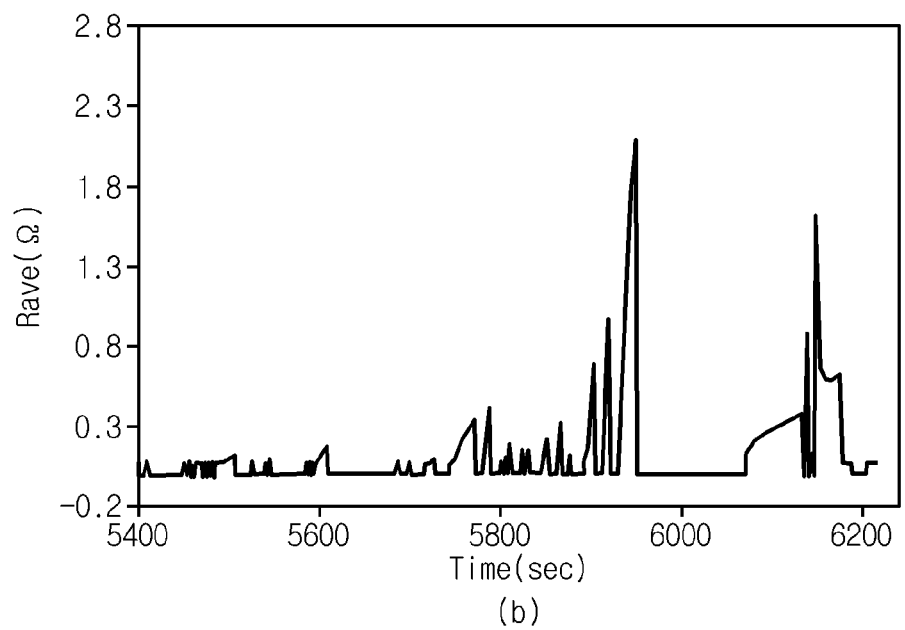

FIGS. 6 and 7 show graphs for reference in the explanation of a difference between use and non-use of the reference open circuit voltage value when calculating the resistance value of internal resistance of the LFP battery. The graphs shown in FIGS. 6 and 7 are obtained through previous experiments performed while maintaining the temperature of the LFP battery B at 25° C., and the reference SOC is set to 99%. Specifically, (a) of FIG. 6 is a graph showing a voltage curve of the LFP battery B over time, and (b) of FIG. 6 is a graph showing a current curve of the LFP battery B over time. Additionally, (a) of FIG. 7 is a graph showing a first internal resistance curve for $R_{ave}$ calculated by the apparatus 100 while the voltage and current of the LFP battery B follow the voltage curve and the current curve shown in FIG. 6, and (b) of FIG. 7 is a graph showing a second internal resistance curve for $R_{ave}$ calculated by the apparatus 100 while the voltage and current of the LFP battery B follow the voltage curve and the current curve shown in FIG. 6. Here, the first internal resistance curve in (a) of FIG. 7 appears when the reference OCV value is allocated to $OCV_{ref}$ of Equation 1, and the second internal resistance curve in (b) of FIG. 7 appears when instead of the reference OCV value, 0 volt is allocated to $OCV_{ref}$ of Equation 1.

First, seeing the graph shown in (a) of FIG. 7, the first internal resistance curve has the resistance value of 0Ω or less for the majority of time, rapidly increases near 6200 seconds, and reaches the reference resistance value 0.0014Ω corresponding to 25° C. at 6217 seconds. Accordingly, the control unit 140 may calibrate the SOC of the LFP battery B to 99% at the point in time $P_{cali}$ corresponding to 6217 seconds on the graph in (a) of FIG. 7.

Next, dissimilar to the first internal resistance curve, the second internal resistance curve of the graph shown in (b) of FIG. 7 does not show a rapid rise near 6200 seconds. This is because $OCV_{ref}$ of Equation 1 plays a role such as a sort of noise filter. That is, if $I_{ave}$ is a positive number, in the presence of the reference OCV value-allocated $OCV_{ref}$ in Equation 1, when $V_{ave}$ equal to or less than $OCV_{ref}$ is inputted to Equation 1, $R_{ave}$ is 0 or a negative number, and in other cases, $R_{ave}$ is a positive number. Accordingly, the control unit 140 can calibrate SOC of the LFP battery B while $R_{ave}$ of Equation 1 is calculated to be a positive number. In contrast, under the assumption that $I_{ave}$ is a positive number, when 0 volt is allocated to $OCV_{ref}$ of Equation 1, the symbol of $R_{ave}$ only relies on $V_{ave}$, making it difficult to accurately select a point to perform SOC calibration of the LFP battery B.

In describing various embodiments of the present disclosure, it may be understood that the components designated by '~ unit' are elements which are classified functionally rather than physically. Accordingly, each component may be selectively combined with other component, or may be divided into subcomponents efficient execution of control logic(s). However, it is obvious to those skilled in the art that even though the components are combined or divided, if functions are recognized as being the same, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

What is claimed is:

1. A battery management apparatus for calibrating a state of charge (SOC) of a lithium iron phosphate (LFP) battery, the battery management apparatus comprising:
   a voltage measuring unit configured to measure a voltage of the LFP battery and output a voltage value indicative of the measured voltage;
   a current measuring unit configured to measure a current of the LFP battery and output a current value indicative of the measured current; and
   a control unit configured to individually receive the voltage value and the current value and determine the SOC of the LFP battery based on results of integrating the current value over time,
   when the control unit enters calibration mode, the control unit is configured to:
   calculate an average voltage value of voltage values received from the voltage measuring unit for a predefined time,
   calculate an average current value of current values received from the current measuring unit for the predefined time,
   calculate an average internal resistance value of the LFP battery for the predefined time based on the average voltage value and the average current value,
   determine if the average internal resistance value is equal to or larger than a preset reference resistance value, and
   when the average internal resistance value is equal to or larger than the reference resistance value, calibrate the determined SOC to a preset reference SOC,
   wherein the control unit is programmed to select the preset reference resistance value corresponding to a temperature of the LFP battery.

2. The battery management apparatus according to claim 1, further comprising:
   a temperature measuring unit configured to measure the temperature of the LFP battery and output a temperature value indicative of the measured temperature,
   wherein the control unit is configured to determine the SOC of the LFP battery further based on the temperature value outputted by the temperature measuring unit.

3. The battery management apparatus according to claim 2, further comprising:
   a memory unit configured to store a lookup table defining a correspondence relationship between preset reference temperature values and reference resistance values.

4. The battery management apparatus according to claim 3, wherein the lookup table includes:
   a first storage area in which a first reference temperature value and a first reference resistance value associated with the first reference temperature value are recorded; and
   a second storage area in which a second reference temperature value larger than the first reference temperature value and a reference resistance value associated with the second reference temperature value are recorded, and the first reference resistance value is large than the second reference resistance value.

5. The battery management apparatus according to claim 3, wherein the control unit is configured to:
select any one reference temperature value recorded in the lookup table based on the temperature value received from the temperature measuring unit for the predefined time,
select a reference resistance value corresponding to the reference temperature value elected from the lookup table, and
when the average internal resistance value is equal to or larger than the selected reference resistance value, calibrate the determined SOC to the reference SOC.

6. The battery management apparatus ac according to claim 1, wherein the reference resistance value is a value indicative of an internal resistance of the LFP battery when the SOC of the LFP battery is equal to the reference SOC.

7. A battery management apparatus for calibrating a state of charge (SOC) of a lithium iron phosphate (LFP) battery, battery management apparatus comprising:
a voltage measuring unit configured to measure a voltage of the LFP battery and output a voltage value indicative of the measured voltage;
a current measuring unit configured to measure a current of the LFP battery and output a current value indicative of the measured current; and
a control unit configured to individually receive the voltage value and the current value and determine the SOC of the LFP battery based on results of integrating the current value over time,
when the control unit enters calibration mode, the control unit is configured to:
calculate an average voltage value of voltage values received from the voltage measuring unit for a predefined time,
calculate an average current value of current values received from the current measuring unit for the predefined time,
calculate an average internal resistance value of the LFP battery, for the predefined time based on the average voltage value and the average current value,
determine if the average internal resistance value is equal to or larger than a preset reference resistance value, and
when the average internal resistance value is equal to or larger than the reference resistance value, calibrate the determined SOC to a preset reference SOC,
wherein the control unit is configured to calculate the average internal resistance value using the following Equation 1:

$$R_{ave} = \frac{V_{ave} - OCV_{ref}}{I_{ave}} \qquad \text{<Equation 1>}$$

in which in the Equation 1, $V_{ave}$ is the average voltage value, $I_{ave}$ is the average current value, $OCV_{ref}$ is a preset reference open circuit voltage (OCV) value, is the average internal resistance value, and
the reference OCV value is a value indicative of an OCV of time LFP battery when the SOC of the LFP battery is equal to the reference SOC.

8. The battery management apparatus according to claim 1, wherein the predefined time is a specified value that is equal to or larger than 1 second and equal to or smaller than 2 seconds, and the reference SOC is a value indicating that a remaining capacity of the LFP battery is 99% of design capacity.

9. A battery pack comprising the battery management apparatus according to claim 1.

10. A method for calibrating a state of charge (SOC) of a lithium iron phosphate (LFP) battery, comprising:
receiving a voltage value indicative of a voltage of the LFP battery;
receiving a current value indicative of a current of the LFP battery;
determining the SOC of the LFP battery based on results of integrating the current over me; and
calibrating the determined SOC by entering calibration mode,
wherein the calibrating the determined SOC comprises:
calculating an average voltage value of voltage values received for a predefined time;
calculating an average current value of current values received for the predefined time;
calculating an average internal resistance value of the LFP battery for the predefined time based on the average voltage value and the average current value;
selecting the preset reference resistance value corresponding to a temperature of the LFP battery;
determining if the average internal resistance value is equal to or larger than the preset reference resistance value; and
when the average internal resistance value is equal to or larger than the reference resistance value, calibrating the determined SOC to a preset reference SOC.

11. The method according to claim 10, further comprising calculating the average internal resistance value using the following Equation 1:

$$R_{ave} = \frac{V_{ave} - OCV_{ref}}{I_{ave}} \qquad \text{<Equation 1>}$$

in which in the Equation 1, $V_{ave}$ is the average voltage value, $I_{ave}$ is the average current value, $OCV_{ref}$ is a preset reference open circuit voltage (OCV) value, $R_{ave}$ is the average internal resistance value, and
the reference OCV value is a value indicative of an OCV of the LFP battery when the SOC of the LFP battery is equal to the reference SOC.

12. The method according to claim 10, wherein the predefined time is a specified value that is equal to or larger than 1 second and equal to or smaller than 2 seconds, and
the reference SOC is a value indicating that a remaining capacity of the LFP battery is 99% of design capacity.

13. The method according to claim 10, further comprising:
measuring, via a temperature measuring unit, the temperature of the LFP battery and output a temperature value indicative of the measured temperature; and
determining the SOC of the LFP battery further based on the temperature value outputted by the temperature measuring unit.

14. The method according to claim 13, further comprising:
selecting any one reference temperature value recorded in a lookup table based on the temperature value received from the temperature measuring unit for the predefined time;

selecting a reference resistance value corresponding to the reference temperature value selected from the lookup table; and when the average internal resistance value is equal to or larger than the selected reference resistance value, calibrating the determined SOC to the preset reference SOC.

15. The battery management apparatus according to claim 1, further comprising a memory unit configured to store a lookup table defining a correspondence relationship between preset reference temperature values and reference resistance values wherein the lookup table includes:

a first, storage area in which a first reference temperature value and a first reference resistance value associated with the first reference temperature value are recorded; and a second storage area in which a second reference temperature value larger than the first reference temperature value and a reference resistance value associated with the second reference temperature value are recorded, and the first reference resistance value is larger than the second reference resistance value.

* * * * *